United States Patent
Eckstein et al.

(10) Patent No.: US 11,062,929 B2
(45) Date of Patent: Jul. 13, 2021

(54) DEVICE AND METHOD FOR TREATING SUBSTRATES USING A SUPPORT ROLLER HAVING A POROUS MATERIAL

(71) Applicant: SINGULUS TECHNOLOGIES AG, Fuerstenfeldbruck (DE)

(72) Inventors: Jens Eckstein, Dachau (DE); Peter Reustle, Walheim (DE); Mathias Hohlmayer, Diessen am Ammersee (DE); Uemit Seyhan, Singen (DE); Benjamin Mandlmeier, Poecking (DE); Michael Reising, Moembris (DE); Stefan Kempf, Alzenau (DE); Jan-Christof Jacobi, Dautphetal-Holzhausen (DE)

(73) Assignee: SINGULUS TECHNOLOGIES AG, Fuerstenfeldbruck (DE)

( * ) Notice: Subject to any disclaimer, the term of this patent is extended or adjusted under 35 U.S.C. 154(b) by 184 days.

(21) Appl. No.: 16/223,014

(22) Filed: Dec. 17, 2018

(65) Prior Publication Data

US 2019/0122914 A1    Apr. 25, 2019

Related U.S. Application Data

(63) Continuation of application No. PCT/EP2017/064781, filed on Jun. 16, 2017.

(30) Foreign Application Priority Data

Jun. 17, 2016   (DE) .................... 10 2016 210 883.2

(51) Int. Cl.
*H01L 21/677* (2006.01)
*H01L 21/67* (2006.01)
(Continued)

(52) U.S. Cl.
CPC ........ *H01L 21/67706* (2013.01); *B05C 1/025* (2013.01); *H01L 21/02041* (2013.01);
(Continued)

(58) Field of Classification Search
None
See application file for complete search history.

(56) References Cited

U.S. PATENT DOCUMENTS

| | | |
|---|---|---|
| 3,616,742 A | 11/1971 | Boyle et al. |
| 4,370,356 A | 1/1983 | Bok et al. |

(Continued)

FOREIGN PATENT DOCUMENTS

| | | |
|---|---|---|
| DE | 69428374 T2 | 7/2002 |
| DE | 102007063202 A1 | 6/2009 |

(Continued)

OTHER PUBLICATIONS

Machine Generated English Translation of the abstract JP2006-245221A. Published in Sep. 14, 2006. (Year: 2006).*

(Continued)

*Primary Examiner* — Sylvia MacArthur
(74) *Attorney, Agent, or Firm* — Michael A. Glenn; Perkins Coie LLP

(57) ABSTRACT

A device for treating substrates by a treating liquid has at least one rotatably supported support roller which a substrate to be treated rests on during operation. The support roller has a hollow cylinder having a porous rigid material which the substrate to be treated rests on during operation. The device is configured to deliver, during operation, treating liquid via the interior of the hollow cylinder of the at least one support roller through the porous rigid material to the external surface of the hollow cylinder in order to treat at least one surface of the substrate by the treating liquid. The device is configured to treat several substrates in the form of plate- (Continued)

shaped separate wafers arranged one behind the other and/or next to one another in the device, by the treating liquid and to transport the substrates in a transport plane during the treatment.

19 Claims, 6 Drawing Sheets

(51) Int. Cl.
*H01L 21/306* (2006.01)
*H01L 21/02* (2006.01)
*B05C 1/02* (2006.01)

(52) U.S. Cl.
CPC .... *H01L 21/30604* (2013.01); *H01L 21/6715* (2013.01); *H01L 21/67057* (2013.01); *H01L 21/6776* (2013.01); *H01L 21/67086* (2013.01)

(56) References Cited

U.S. PATENT DOCUMENTS

| | | | |
|---|---|---|---|
| 5,270,079 | A | 12/1993 | Bok |
| 7,943,526 | B2 | 5/2011 | Delahaye |
| 2010/0311247 | A1 | 12/2010 | Kappler |
| 2012/0255488 | A1* | 10/2012 | Rebstock ................. B05C 1/10 |
| | | | 118/255 |
| 2013/0019909 | A1* | 1/2013 | Park .................. H01L 21/67706 |
| | | | 134/124 |
| 2013/0186328 | A1 | 7/2013 | Chang et al. |
| 2019/0122914 | A1* | 4/2019 | Eckstein ........... H01L 21/67057 |

FOREIGN PATENT DOCUMENTS

| | | |
|---|---|---|
| EP | 0376207 A2 | 7/1990 |
| EP | 0746421 A1 | 12/1996 |
| EP | 0752807 A1 | 1/1997 |
| EP | 1733418 B1 | 9/2010 |
| JP | 05261326 A | 10/1993 |
| JP | 2006-245221 A | 9/2006 |
| WO | 2015/017331 A1 | 2/2015 |

OTHER PUBLICATIONS

Machine Generated English Translation of the description of JP2006-245221A. Published in Sep. 14, 2006. (Year: 2006).*
Machine Generated English Translation of the claims of JP2006-245221A. Published in Sep. 14, 2006. (Year: 2006).*
Machine Generated English Translation of the abstract KR 101279378 Published in Jul. 24, 2013 (Year: 2013).*
Machine Generated English Translation of the description of KR 101279378 Published in Jul. 24, 2013 (Year: 2013).*
Machine Generated English Translation of the claims of KR 101279378 Published in Jul. 24, 2013 (Year: 2013).*

* cited by examiner

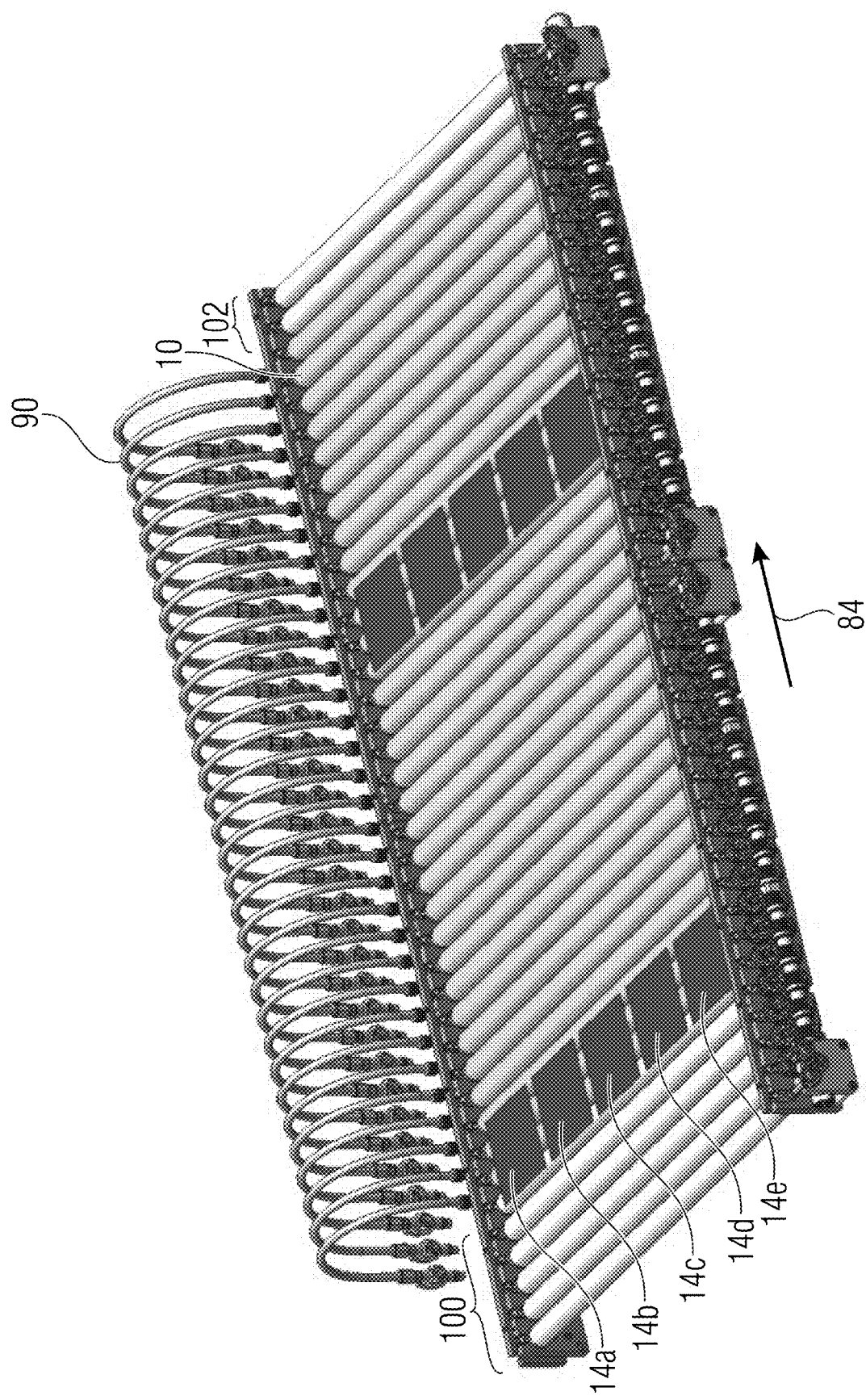

DEVICE AND METHOD FOR TREATING SUBSTRATES USING A SUPPORT ROLLER HAVING A POROUS MATERIAL

CROSS-REFERENCE TO RELATED APPLICATIONS

This application is a continuation of copending International Application No. PCT/EP2017/064781, filed on Jun. 16, 2017, which is incorporated herein by reference in its entirety, and additionally claims priority from German Application No. 10 2016 210 883.2, filed Jun. 17, 2016, which is also incorporated herein by reference in its entirety.

BACKGROUND OF THE INVENTION

The present invention relates to devices and methods for treating substrates and, in particular, to such devices and methods suitable for treating horizontally oriented substrates using at least one support roller which the substrates rest on during operation.

It is known from U.S. Pat. No. 3,616,742 A that porous rollers may be used to transport flat goods, i.e. film, and to treat same successively by a developer liquid, a fixing liquid and a rinsing solution. Here, the liquid from the interior is transported through a soft sponge-like roller made of plastics in order to wet the film during horizontal transport in a plane.

A method for treating silicon wafers is known from DE 10 2007 063 202 A1, in which, in a first step, an etching solution is applied/sprayed on from above and, in a second step, the silicon wafers, with the same orientation as in the first step, are wetted from below by an etching solution for polishing etching. Wetting from below is done using transport rollers for the silicon wafers which are immersed for the most part in a bath containing the etching solution.

A method for unilaterally wet-chemically treating silicon slices is known from EP 1 733 418 B1, in which silicon slices, for electrically insulating the top and the bottom thereof, are wetted by an etching liquid from below only indirectly using transport rollers located in a liquid bath.

A device for coating wafers, like semiconductor wafers, by a photoresist is known from EP 0 376 207 A2. A rotatable roller is arranged relative to two dams such that a meniscus forms between one of the dams and a wafer transported via the rollers, by means of which the bottom of the wafer is wetted. The roller may be a smooth cylinder-shaped rod. Wetting can be varied by grooves on the rod. The liquid supply is realized by a supply unit and the rod is guided by a rod support unit.

A method for coating a substrate, like a silicon wafer, for example, using a porous applicator is known from U.S. Pat. No. 5,270,079, A. The applicator is arranged to be stationary in a basin and a substrate is guided past the applicator using transport means in the form of a vacuum clamping chuck. The substrate is spaced apart from the applicator so that a meniscus forms between the applicator and the substrate. A similar method is known from U.S. Pat. No. 4,370,356.

Methods for processing substrates are known from WO 2015/017331 A1, in which substrates are moved via transport rollers, wherein reservoirs having an open or perforated top side are arranged between the transport rollers in order to supply a treating liquid to the substrates.

SUMMARY

According to an embodiment, a device for treating substrates by a treating liquid may have: at least one rotatably supported support roller which a substrate to be treating rest on during operation, wherein the support roller has a hollow cylinder having a porous rigid material which the substrate to be treated rests on during operation, wherein the device is configured to deliver, during operation, treating liquid via the interior of the hollow cylinder of the at least one support roller through the porous rigid material to the external surface of the hollow cylinder in order to treat at least one surface of the substrate by the treating liquid, wherein the device is configured to treat several substrates in the form of plate-shaped separate wafers arranged one behind the other and/or next to one another in the device by the treating liquid and to transport the substrates in a transport plane during treatment, wherein the at least one support roller is supported to be rotatable at lateral portions in an axial direction, wherein the device additionally has bearing means having a surface which is opposite to a portion of the external surface of the hollow cylinder between the lateral portions, wherein the bearing means, when delivering the treating liquid to the external surface of the hollow cylinder, represents a liquid bearing for the support roller, wherein the bearing means has the shape of cylinder shell, wherein axial ends of the cylinder shell are open to allow draining of the treating liquid.

According to another embodiment, a method for treating substrates by a treating liquid using an inventive device as mentioned above may have the step of: delivering treating liquid via the interior of the hollow cylinder of the at least one support roller through the porous rigid material to the external surface of the hollow cylinder in order to treat the at least one surface of the substrate by the treating liquid.

In accordance with an embodiment, a device for treating substrates by a treating liquid has at least one rotatably supported support roller which a substrate to be treated rests on during operation. This support roller comprises a hollow cylinder comprising a porous rigid material which the substrate to be treated rests on. The device is configured to deliver, during operation, treating liquid via the interior of the hollow cylinder of the at least one support roller through the porous rigid material to the external surface of the hollow cylinder in order to treat at least one surface of the substrate by the treating liquid.

In accordance with an embodiment, a method for treating substrates by a treating liquid using such a device comprises delivering treating liquid via the interior of the at least one support roller through the porous rigid material to the external surface of the hollow cylinder in order to treat the at least one surface of the substrate by the treating liquid.

Embodiments of the invention are based on the finding that a roller comprising an external hollow cylinder having a porous material or being made from a porous material may serve as a support for the substrate while treating a lower side of the substrate by a treating liquid, wherein the lower side of the substrate can be wetted by delivering the treating liquid via the interior of the hollow cylinder and through the porous hollow cylinder to the lower side of the substrate. Thus, embodiments of the invention allow uniform treatment on the one hand and increased flexibility on the other hand, since the treating liquid used may be varied easily and, when several support rollers are provided, different treating liquids can be supplied via the different rollers.

BRIEF DESCRIPTION OF THE DRAWINGS

Embodiments of the invention will be detailed subsequently referring to the appended drawings, in which:

FIG. 9 is a schematic illustration of a device configured for treating several substrates arranged next to one another and/or one behind the other.

DETAILED DESCRIPTION OF THE INVENTION

Figure 1:
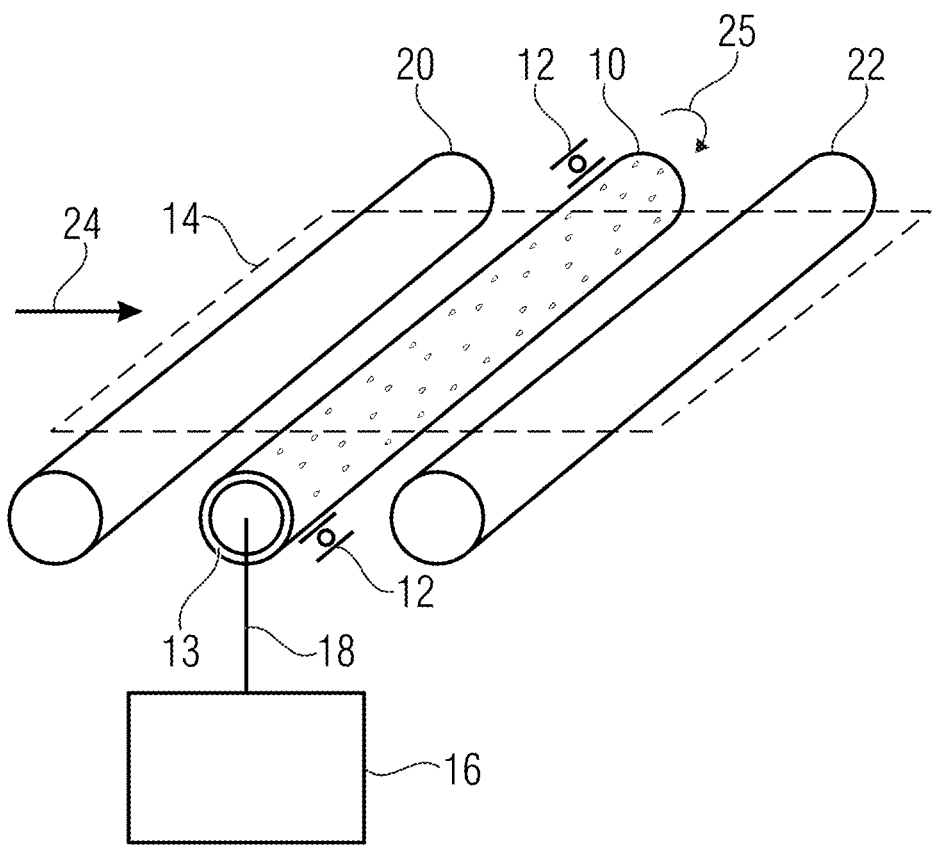
FIG. 1 is a schematic illustration of a device for treating substrates using a porous roller.

FIG. 1 shows a perspective illustration of an embodiment of a device for treating substrates, comprising a support roller 10. The support roller 10 is supported to be rotatable, as is indicated by bearings 12 which are arranged at axially lateral portions of the support roller. The bearings 12 may, for example, be ball bearings. The support roller 10 comprises a hollow cylinder 13 comprising a porous rigid material which a substrate 14 to be treated rests on during operation. In embodiments, the porous rigid material is exposed relative to the outside so that the substrate 14 to be treated rests on the porous material.

The device is configured to deliver, during operation, treating liquid via the interior of the hollow cylinder 13 to the external surface of the hollow cylinder 13 in order to treat at least one surface of the substrate, i.e. the lower surface of the substrate by the treating liquid. Consequently, the substrate is wetted from below. Means for delivering treating liquid to the support roller 10 may comprise a treating liquid reservoir 16 and a fluid line 18 which couples the treating liquid reservoir fluidically to the interior of the hollow cylinder of the support roller in order to supply the treating liquid to the support roller 10. The treating liquid is supplied at a pressure sufficient to overcome the resistance of the pores of the porous material. The pressure used depends on the pore size of the porous material.

Consequently, embodiments provide for a one-sided treatment of substrates. A substrate here is to be understood to be a plate-shaped body having two main surfaces which are connected to each other by one or several (circumferential) side areas. One-sided treatment here is to be understood to be such a treatment where one main surface of the substrate is treated, or even such a treatment where one the main surfaces of the substrate and at least parts of the side areas of the substrate are treated.

In embodiments, the support roller 10 may be a driven support roller (transport roller) configured to transport the substrate during treatment. As is shown in FIG. 1, in embodiments, the device may comprise further support rollers 20, 21 arranged in front of and behind the support roller 10 in the transport direction. The support rollers 10, 20 and 22 are arranged to provide a horizontal transport plane for the substrate 14. In embodiments, the support rollers 20 and 21 can be driven transport rollers, wherein the support roller 10 can be driven or non-driven. The support rollers 20 and 22 may comprise the same structure as the support roller 10. In embodiments, several support rollers may represent transport means for the substrate so that no separate transport means are required. In alternative embodiments, different transport means may be provided for the substrate, which guides the substrate via the support roller(s), for example in the form of a catching element moving together with the substrate, or in the form of a vacuum clamping chuck.

During operation, the substrate is moved over the support roller in a horizontal orientation, either by the support roller itself serving as the transport roller or by transport means separate from the support roller. The support roller 10 rotates in a direction 25. When the support roller serves as transport roller, it drives the substrate by means of friction during operation and moves the same in the transport direction. When the support roller only serves as a wetting roller and is not driven itself during operation, the roller may rotate together with the substrate which rests on the support roller and is moved over the same.

The hollow cylinder of the support roller comprises a rigid porous material or is formed from a rigid porous material. A rigid material here is understood to be a material which cannot be deformed, i.e. is stiff and non-elastic, so that it cannot be deformed without destroying its structure. In embodiments, the rigid porous material is exposed so that during operation the substrate rests on the porous material. In embodiments, the pores of the porous material may comprise a mean diameter in a range between 0.2 µm and 1 mm, in particular 0.2 µm and 100 µm. In embodiments, the porous material may comprise pores which are distributed homogenously. In embodiments, the pores may be distributed homogenously in an axial direction of the support roller and exhibit a pore size gradient in the radial direction (i.e. over the roller thickness). In embodiments, the porous material may be abrasion-resistant, not contaminate the substrates and be resistant to the treating liquid or treating liquids. In embodiments, the porous material may be a sintered material. In embodiments, the porous material is made of plastics, like PTFE, PE, PVDF, for example. Alternatively, the porous material may be made of a sintered metal.

In embodiments, the porous material on the surface may be functionalized chemically, physically and/or mechanically in order to support the wetting and draining of the treating liquid after contacting the substrate. In embodiments, the surface or areas of the surface may be treated or functionalized so as to be hydrophobic or hydrophilic.

Figure 2:
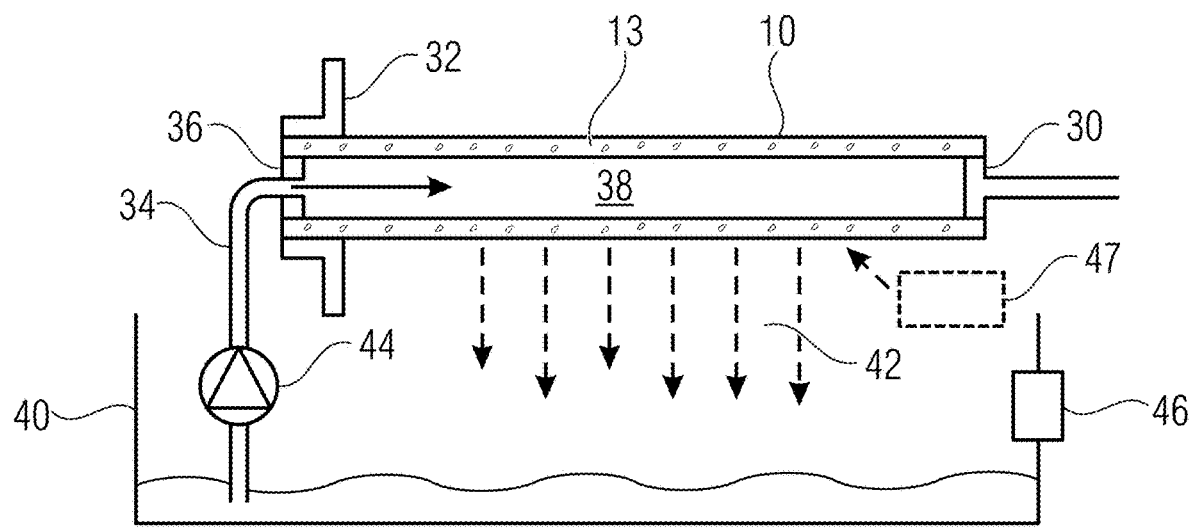
FIG. 2 is a schematic illustration of a device for treating substrates in a section transverse to the direction of movement of the substrate.

FIG. 2 shows a sectional view of an embodiment transverse to the direction of movement of the substrate. The support roller 10 here is supported to be rotatable via an internal roller bearing 30 at a first axial end and is supported to be rotatable via an external roller bearing 32 at a second axial end. In addition, at the second axial end, a fluid line 34 is fluidically coupled to the interior 38 of the hollow cylinder of the support roller 10 via a rotary coupler 36. The device comprises a liquid reservoir 40 which contains the treating liquid. The liquid reservoir 40 is arranged below the support roller 10 and is configured to receive treating liquid which reaches the external surface of the support roller 10 through the pores of the hollow cylinder 13 and drops from the support roller 10, as is indicated in FIG. 2 by arrows 42. The fluid line 34 is fluidically coupled to the treating liquid in the liquid reservoir via a pump 44 in order to deliver treating liquid from the liquid reservoir to the interior of the support roller 10.

Figure 3:
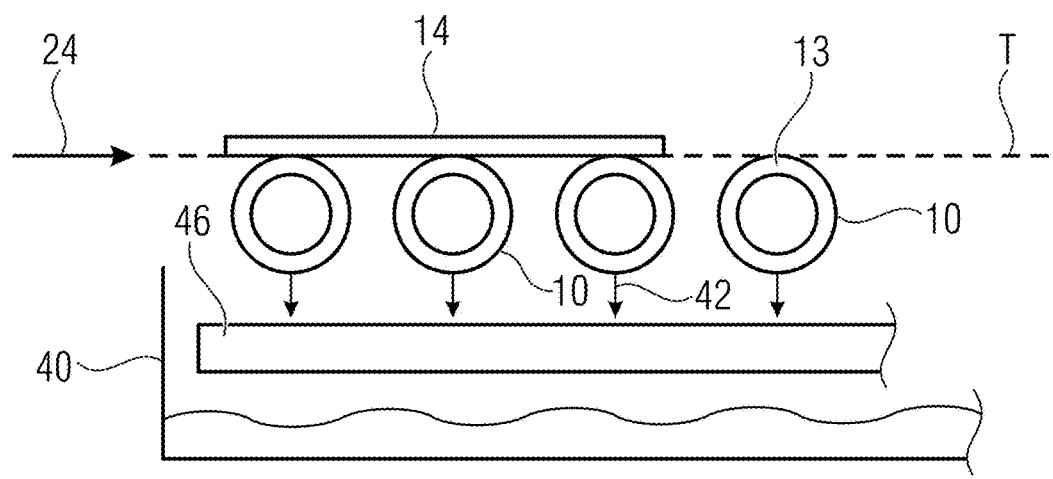
FIG. 3 is a schematic illustration of the device of FIG. 2 in a section longitudinal to the direction of movement of the substrate.

Optionally, the device may comprise suction means 46 configured to suck in vapor or gases forming during the treatment. The suction means may extend longitudinally along the direction of movement 24 of the substrate 14, as can be gathered from FIG. 3. As can also be gathered from FIG. 3, a plurality of corresponding support rollers the axes of which are parallel to one another, may be arranged one behind the other in the transport direction 24 and define a horizontal transport plane T for the substrate 14, which is illustrated in FIG. 3 as a broken line. In FIGS. 2 and 3, the suction means is illustrated to be below the transport plane 11. However, it is obvious that the suction means may also be arranged laterally to or above the transport plane 11 in order to implement suction from the side or from above. The suction means may also be arranged between the rollers. In embodiments, means may be provided for pressing downwards and then sucking off vapors from above the transport plane, thereby protecting the surface of the substrates.

Optionally, a device for feeding an additional medium onto the substrate 14 and/or the support roller 10 may be provided, like below the transport plane T, as is indicated schematically in FIG. 2 by the reference numeral 47.

In general, during operation, the treating liquid is pumped to the interior of the support roller under pressure so that the treating liquid passes (diffuses) through the wall of the porous hollow cylinder and produces an (advantageously complete) liquid film on the roller surface. From there, it comes into contact with the lower side of the substrate so as to treat the same, and then flows vertically downwards, as is indicated in FIGS. 2 and 3 by the arrows 42, for example.

Figure 4:
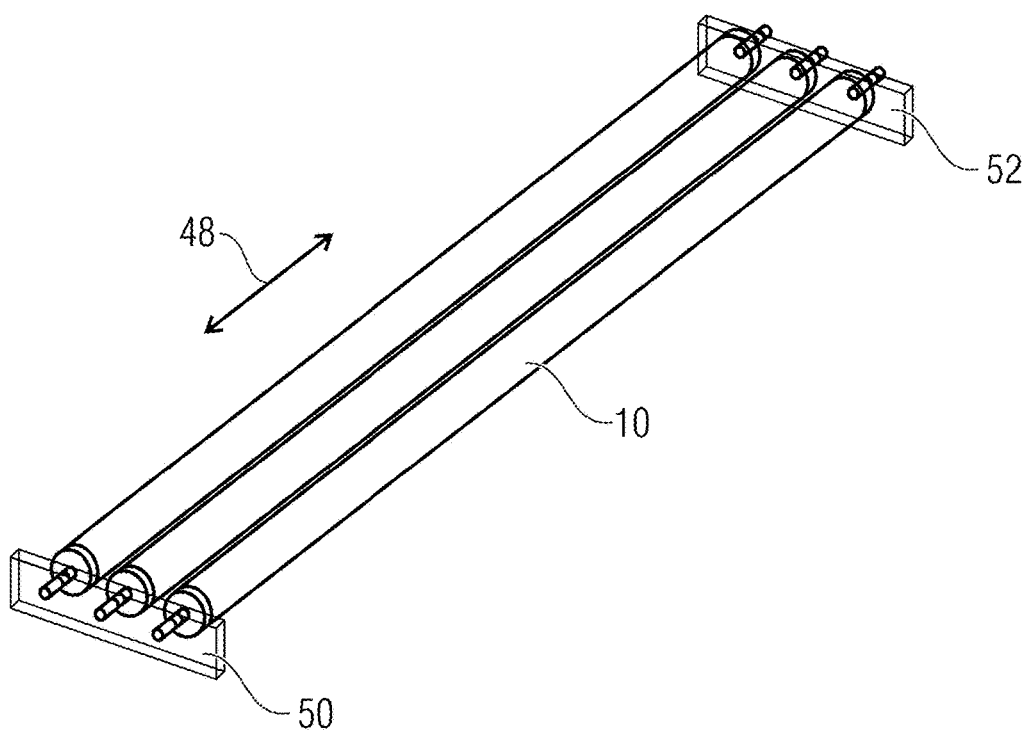
FIG. 4 is a schematic perspective illustration of three support rollers.

As has already been discussed, embodiments comprise a plurality of support rollers arranged one behind the other in the direction of transport of the substrate. Exemplarily, FIG. 4 shows an arrangement having three rollers, wherein, however, it is obvious that the device may comprise a different number of respective rollers. In accordance with FIG. 4, the support rollers are supported to be rotatable at both ends in an axial direction 48, i.e. at both axial ends, using bearing plates 50 and 52 and bearings, like ball bearings. In embodiments having several support rollers, means are provided advantageously for feeding at least some of or all the support rollers with treating liquid directly and separately from the other support rollers.

In embodiments, the device additionally comprises bearing means comprising a surface which is opposed to a portion of the external surface of the hollow cylinder between the portions where the support roller is supported to be rotatable, such that the treating liquid delivered through the interior to the external surface of the hollow cylinder represents a hydrostatic or hydrodynamic liquid bearing for the support roller, together with the bearing means. There may be such a distance between the opposing surfaces that, due to the flow resistance caused by this which the treating liquid driven from the surface of the support roller is subjected to, a pressure forms between the opposing surfaces, thereby achieving the bearing effect. In embodiments, the bearing means is arranged below the transport plane in which the substrate or substrates is/are transported during the treatment, which is typically horizontal.

Figure 5A:
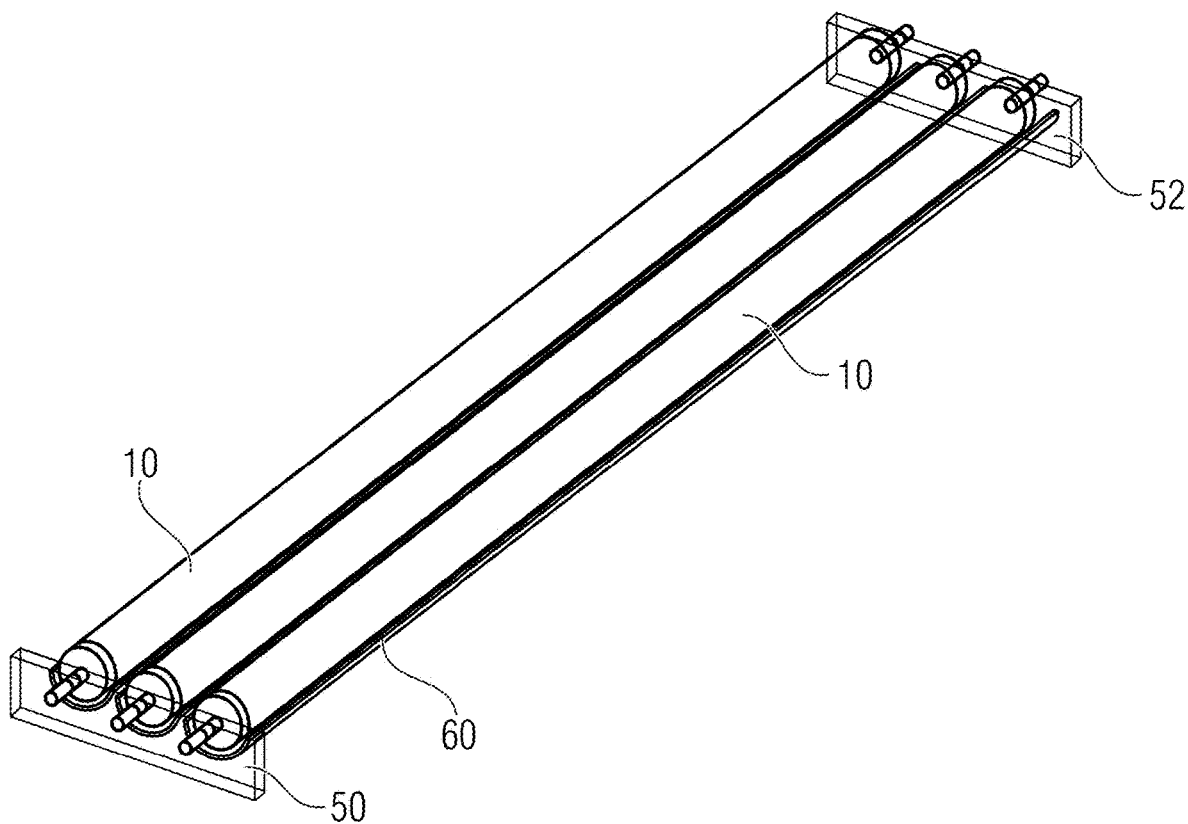
FIG. 5a is a schematic perspective illustration of three support rollers comprising bearing means.

FIG. 5*a* shows an embodiment in which each support roller 10 has a corresponding bearing means in the form of a semi-cylinder shell 60 associated thereto. The semi-cylinder shell has greater a diameter than the associated support roller and the interior surface of the semi-cylinder shell 60 is opposed to the lower half of the associated support roller with a distance there between so that a liquid film forms between the same, which represents a liquid bearing for the support roller. The bearing means 60 of the different support rollers 10 are separate from one another and do not form a common liquid bath.

Figure 5B:
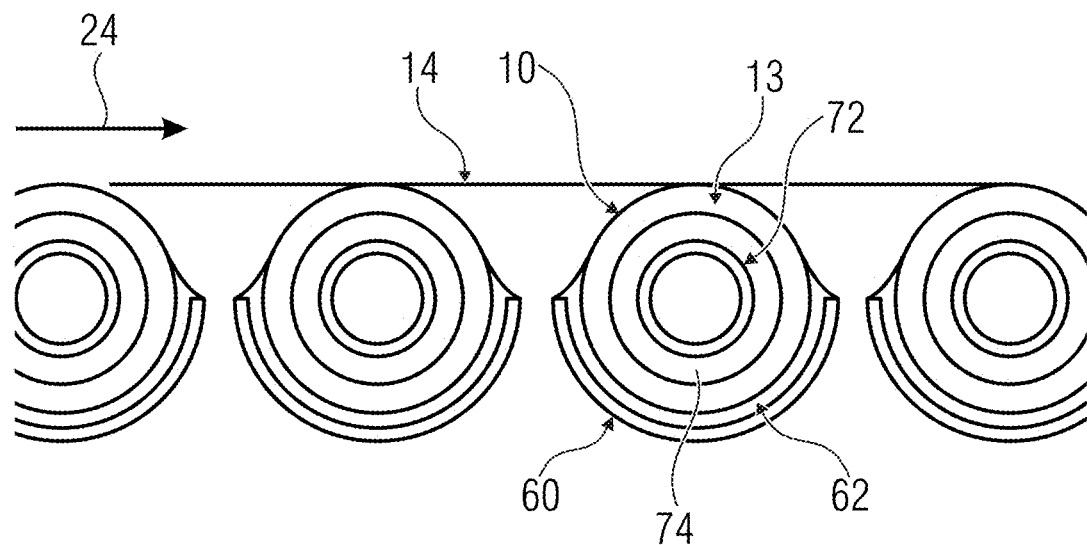
FIG. 5b is a schematic illustration of support rollers comprising bearing means in cross section.

FIG. 5*b* shows an arrangement of corresponding semi-cylinder shells 60 for four support rollers in cross section. As can be seen, the bearing means 60 which are associated to different support rollers are spaced apart from one another in the transport direction 24. A liquid film 62 forms between the support roller 10 and the bearing means 60 of a respective roller unit of a support roller and bearing means. In embodiments, the distance between neighboring rollers, in relation to the length of the substrates in the transport direction, can be such that the substrates will rest on at least two rollers. In embodiments, the distance between neighboring rollers may be smaller than half the substrate length.

FIG. 5*b* thus illustrates the principle of homogenously wetting a substrate 14 by a treating liquid. The treating liquid enters into contact with a cavity 74 between a filling pipe 72 and the hollow cylinder 13 of the support roller 10 which the substrate 14 rests on, via said filling pipe 72 provided with openings, wherein the transport direction is again indicated by an arrow 24. An opening symmetry of the openings in the filling pipe 72 may vary considerably, for example as regards the distances among one another and the pattern (like spiral pattern). The filling pipe 72 with the openings and the gap act as a distributor system in order to distribute the treating liquid within the hollow cylinder 13. During operation, the treating liquid exits via the pores of the hollow cylinder and wets the substrate 14. The respective support roller 10 is supported by liquid bearing, caused by the associated bearing shell 60 below the transport plane with the distance to the support roller. In addition, by means of the support roller 10 rotating, the bearing shell 60 may level the liquid film formed on the support roller 10. In addition, the total volume used of the treating liquid is reduced considerably by the bearing shells 60.

In the embodiment shown, the bearing shells are mounted below the transport plane. The opening angle of the bearing shells and/or the distance between two roller units can be adjusted such that at least two neighboring bearing shells do not contact. The bearing shells may be formed from a material which is resistant to chemicals, and may be made of PTFE, PE, PVDF, for example.

Thus, embodiments allow increasing the rigidity and linearity of the support rollers and, consequently, the wetting unit and/or the transport unit, thereby allowing continuous and homogenous treatment of substrates by providing liquid bearing means below the transport plane which supports the support roller by a liquid bearing. With liquid exiting from the porous hollow cylinder, the support roller is thus supported by a liquid bearing, offering increased stability for the rotating roller.

In embodiments, the bearing means additionally offer an increased treating homogeneity by homogenously distributing the liquid film on the roller surface by the bearing means (for example the bearing shell) uniformly across subareas/or the entire length of the transport roller and, thus, at least one substrate. Treating liquid consumed or reacted and reaction products may be drained from the substrate.

Figure 5C:
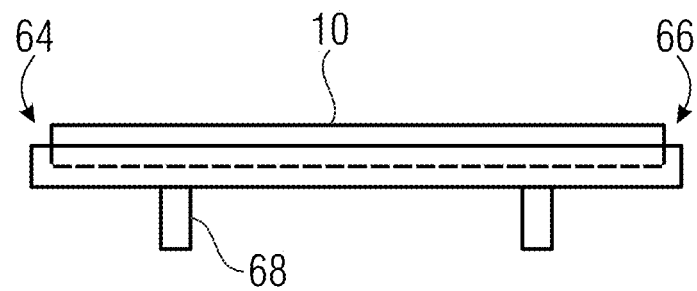
FIGS. 5c and 5d are schematic illustrations of different bearing means.

As is shown in FIGS. 5*b* and 5*c*, the length of the bearing shell may extend over the entire axial length of the roller unit. FIG. 5*c* here represents a section perpendicular to the direction of transport. Thus, the bearing means extends continuously from a first axial end 64 of the support roller 10 to a second axial end 66 of the support roller 10. Here, the entire length of the support roller represents a treatment area. In alternative embodiments, the bearing means may be shorter in an axial direction than the support roller, for example, when a treating area does not extend over the entire axial length of the support roller. Treating area here is to be understood to be that area where substrates are treated during operation, i.e. where substrates are supported during operation.

Figure 5D:
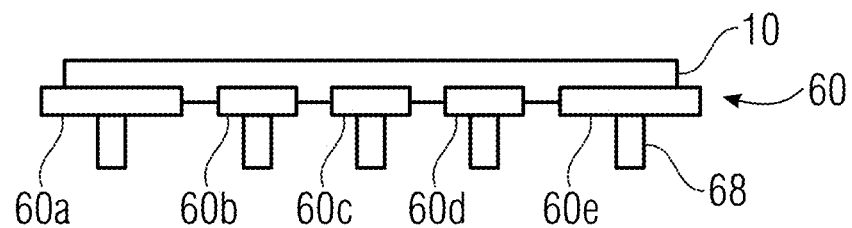

In alternative embodiments, it may be of advantage for the bearing means, for example, the bearing shell to be segmented into several parts. FIG. 5d, for example, shows bearing means segmented into segments 60a to 60e along the axial length of the support roller 10. Each of the segments 60a to 60e here may extend over a portion which corresponds to at least the width of a substrate to be treated. The arrangement shown in FIG. 5d may consequently exemplarily be configured to treat five substrates next to one another at the same time.

In FIGS. 5c and 5d, supporting means 68 for the bearing means 60 are illustrated schematically. In embodiments, the bearing means may be mounted to the bearing plates 50, 52 which also serve for supporting the support rollers 10. The bearing plates 50, 52 may at the same time serve as limitations of the bearing shells so that liquid exiting from the axial ends of the bearing shells may be adjusted or prevented by this. Different means for controlling liquid exiting from the axial ends of the bearing shell, like adjustable dams or stop plates, may also be provided. This allows influencing how the treating liquid drains from the bearing shells 60 after the treatment. It may, for example, be allowed for such a draining to take place mainly via edges extending in axial direction of the bearing shells 60, by sealing the axial ends of the bearing shells 60, or draining to take place mainly via the axial ends, by leaving the axial ends open.

Figure 6:
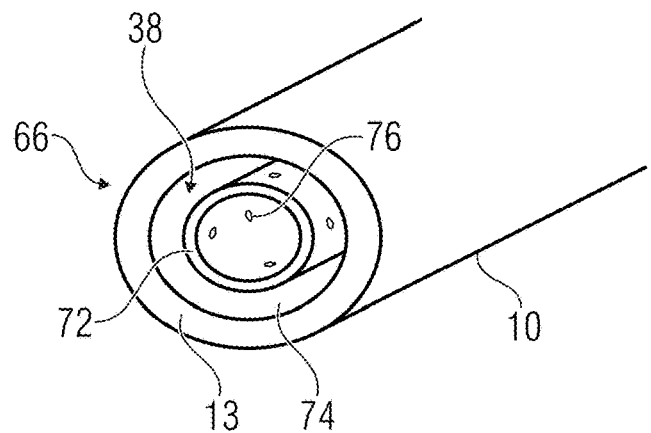
FIG. 6 is a schematic illustration of a support roller.

FIG. 6 shows a schematic illustration of the first end 66 of an embodiment of the support roller 10. The support roller 10 comprises the hollow cylinder 13 comprising a rigid porous material or being made from a rigid porous material. The filling pipe 72 is arranged within 38 the hollow cylinder 13, wherein the hollow cylinder 13 and the filling pipe 72 are arranged concentrically with a gap 74 therebetween. The gap 74 is coupled fluidically to the interior of the filling pipe 72 by openings 76 in the filling pipe 72. Thus, during operation, treating liquid may be introduced to the interior of the filling pipe 72, pass from there to the gap via the openings 76 and then reach the external surface through the porous in the hollow cylinder 13.

The hollow cylinder 13 and the filling pipe 72 may, for example, be fixed to each other in their arrangement and be supported to be rotatable together using two front discs. In alternative embodiments, the hollow cylinder 13 and the filling pipe may be rotatable relative to each other, wherein only the hollow cylinder 13 is supported to be rotatable, whereas the filling pipe is stationary, i.e. not supported to be rotatable.

Figure 7:
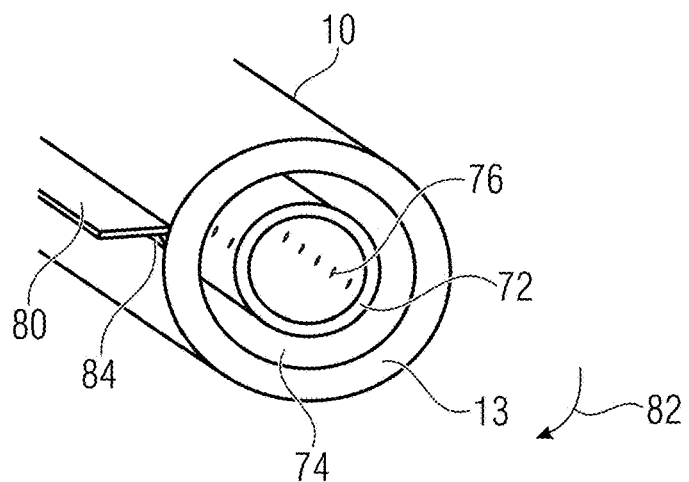
FIG. 7 is a schematic illustration of a support roller comprising leveling means.

In the embodiment shown in FIG. 7, the device additionally comprises leveling means 80 (equalizing unit). The leveling means 80 comprises an edge which extends axially along the external surface of the hollow cylinder 13 in order to homogenize wetting of the external surface by the treating liquid delivered to the external surface. The edge may, for example, be a linear edge. A different shaping of the edge is also conceivable when, for example, using a shaped profile roller. The leveling means may, for example, be formed by at least one plate-like component (in the form of a ledge). The linear edge of the leveling means here may be spaced apart from the external surface of the hollow cylinder by a distance corresponding to the thickness of the homogenized liquid film. In alternative embodiments, the leveling means may be formed to be flexible, contact the support roller in the rest state and, during operation, be deflected from same by the liquid film on the support roller. The sense of rotation is indicated in FIG. 7 by an arrow 82. As is shown, a local accumulation 84 of the treating liquid forms at the back end of the leveling means in the direction of rotation. Liquid wetting is homogenized on the areas of the external surface of the hollow cylinder having passed the leveling means. Thus, the leveling means allows uniform draining of the treating liquid and homogenization of the liquid film before contacting the substrate.

The leveling unit may be provided in addition to the bearing means described. Mounting the leveling means may be independent of the position of the bearing means.

In embodiments, the bearing means itself may act as the leveling means and thus include a double function. The bearing means may stabilize the support roller during rotation by liquid support on the one hand and provide for a continuous concentricity. On the other hand, the bearing means may level the fluid film on the rollers and provide for homogenous draining of the fluid after the substrate treatment. Thus, uniform wetting of the substrate and, consequently, and uniform treatment results can be achieved.

Figure 8:
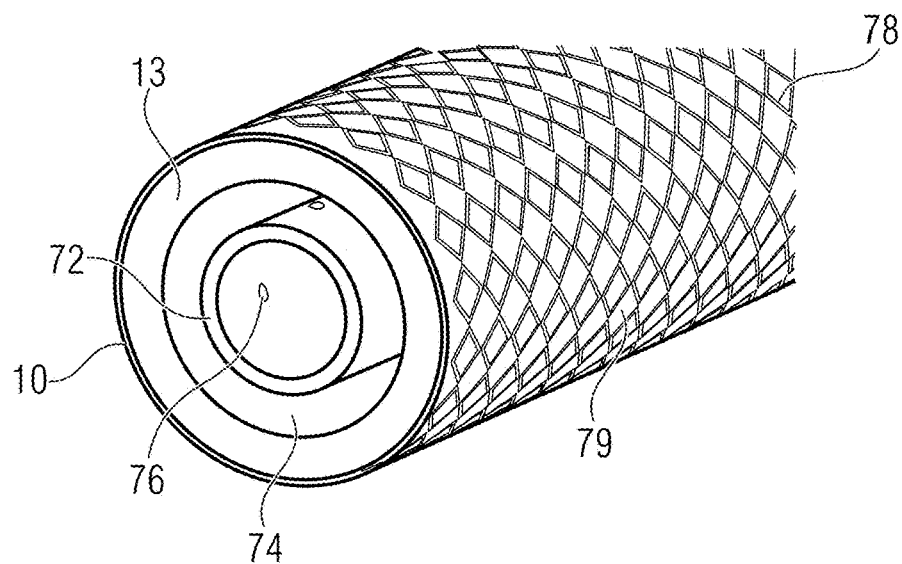
FIG. 8 is a schematic illustration of a support roller having a structured surface.

In embodiments, the external surface of the hollow cylinder may be structured and/or functionalized in order to allow specifically draining treating liquid from the substrate and/or the roller unit. Thus, FIG. 8 shows an embodiment of a support roller 10 where the external surface of the hollow cylinder 13 is structured and comprises recesses and/or protrusions, for example in the form of longitudinal grooves 78 or pockets 79. The recesses and/or protrusions may form a regular pattern on the surface of the hollow cylinder 13. The recesses and/or protrusions may allow homogenous draining of treating liquid from the substrate and/or homogenous draining of the treating liquid from the support roller. In embodiments, the exposed surface of the porous material is structured correspondingly so that the porous material may be configured to allow homogenous draining of treating liquid from the support roller/the substrate.

Exemplarily, local variations in the structure and recesses, like such as are shown in FIG. 8, may be configured to receive treating liquid below the substrate and drain the same off at the edges of the substrate. In embodiments, homogenization of the liquid transport on the porous support roller may be influenced positively by varying the surface of the transport roller in that a functional modification is achieved. Thus, the surface may be modified in order to drain etching residues effectively and quickly when etching substrates, to dispose of excessive treating liquid (medium) when coating and to drain and remove, contaminations and particles from the substrate and the roller when cleaning the same. This modification of the surface of the support roller may be variable in its geometry, in particular rectangular, diamond-shaped, round, oval, and its height and be regular and/or irregular. Typical dimensions of the structures in directions along the surface of the support roller here may be in a range between 100 µm and 1 cm and, in a direction perpendicular to the surface (height), in the range between 10 µm and 1 cm. The dimensions of such surface structures may thus differ from the dimensions of the pore system of the hollow cylinder.

In embodiments, local areas of the surface of the support roller may consequently be formed where treating liquid and/or excessive fluid may collect, and may be removed from the substrate via a draining effect and an additionally provided draining area, thereby improving the result of the treatment. Depending on the geometry and the dynamic pressure, pockets in the surface of the support roller may be filled specifically, or medium transfer to neighboring pockets may be controlled.

In embodiments, a corresponding structuring of the surface of the support roller may be achieved, as has been described, by structuring the porous material without reducing the original support roller diameter, wherein a superstructure on the surface of the support roller consequently is a fixed component of the support roller. In a further development of such embodiments, an superstructure may be obtained by applying a further component onto the porous material of the original supply roller, wherein part of the porous material remains exposed, thereby causing the external overall diameter of the roller unit generated in this way to be greater than the original support roller diameter. Exemplarily, the superstructure may equal a profile, wherein profiling may be formed by rigid or flexible components which are formed to correspond to at least the width of the substrate and, at most, the length of the transport roller. In one example, this may be realized by bushings, hoses and/or pipes which may be made of plastics, like PTFE, PE or PVDF.

FIG. 9 shows an embodiment of a device for treating substrates, integrated into a production line. Input rollers 100 are provided in order to supply several respective substrates 14, like semiconductor wafers, in the example shown five wafers 14a, 14b, 14c, 14d and 14e next to one another to the device for treating substrates, and output rollers 102 are provided in order to transport the substrates away from the device. Consequently, the device may be configured to treat several tracks of wafers in parallel, with a distance between the individual wafers. The device comprises a number of support rollers 10, in the embodiment shown 32. Each of the support rollers is provided with a separate treating liquid supply means in the form of a line 90. Each line 90 is fluidically connected individually to the interior of the associated support roller 10 via rotary coupling. Thus, equal or different treating liquids may be supplied flexibly to the support rollers. Each of the rollers 10 may be driven or non-driven. As is illustrated schematically, suitable motors and gears may be provided in order to drive one or several rollers 10 individually or synchronously to one another.

In embodiments of the method disclosed here, treating liquid is delivered to the substrate via the at least one or several support rollers in order to treat the substrate by the treating liquid, wherein one of the devices disclosed here may be used. In embodiments, the devices and methods are configured to treat substrates in the form of plate-shaped separate wafers. In embodiments, the devices and methods are adapted to treat several substrates arranged one behind the other and/or next to one another in the device, by one or several treating liquids. In embodiments, the wafers can be circular, rectangular or polygonal.

In embodiments, the substrate may be made of a conventional ceramics material or semiconductor material, like a silicon wafer or germanium wafer, for example, and/or may comprise additional coatings. The substrate may, for example, exhibit thicknesses below 500 µm. In embodiments, the substrate may be glass and/or a transparent conductive oxide, or glass which is coated at least on a substrate side by a transparent conductive oxide, and may in this case comprise thicknesses of 20 µm to 3 mm and edge lengths between 5 cm and 250 cm, for example. As a further developed example, the oxide may typically be made of tin, antimony, aluminum, zinc and/or magnesium, for example, and may exist as a mixed oxide and/or be in a doped state. In alternative embodiments, the substrate may consist of plastics films or wafers and in this case exhibit thicknesses of typically 25 µm to 3 mm. In alternative embodiments, the substrate may consist of carbon and/or a carbon compound, like graphene wafer, carbon slices, tissue, film, and in this case may exhibit thicknesses between typically 60 µm to 3 mm.

In embodiments, the device comprises at least two non-contacting rotating units, wherein each rotating unit may function as a transport unit and/or wetting unit. The rotating unit is porous, i.e. the surface of the support roller which the substrate rests on is porous. The device is configured for horizontally transporting at least one substrate. In embodiments, the device is configured for horizontally transporting several substrates next to one another and/or one behind the other, in order to process high quantities in assembly lines, for example. The substrate may be in contact with at least two rotating units of which at least one may represent a transport unit and at least one a wetting unit.

In embodiments, a support roller, in its dimension in the axial direction (measured on the longitudinal axis), corresponds to at least the length of the shortest substrate edge length. During transport and/or wetting, the substrate edges may advantageously be at any angle to the longitudinal axis of the roller unit.

The treating liquid may be guided through a suitable distributing system to the interior of the porous hollow cylinder of the support roller(s). Typically, as has been discussed above, a filling pipe which has openings for a homogenous distribution of liquid within the hollow cylinder and thus represents a distributing system may be used. The filling pipe may take the form of a rigid or flexible cylinder, like a rigid filling pipe or hose, for example.

In embodiments, the treating liquid may be reused for treating using a loop, as has been discussed above referring to FIGS. 2 and 3, for example. In another embodiment, the treating liquid may be subjected to recycling after treating and then be fed in again after recycling. In embodiments, homogenous feeding may take place at at least one position of the support roller, wherein the treating liquid exits from the porous material of the support roller which is typically resistant to chemicals, the result being a fluid contact with the substrate. Wetting may also take place when there is no transport. Further wetting over the entire area of the lower side of the substrate takes place by transporting the treating liquid over the surface and by further treating liquid exiting from the porous material of the rotating support roller.

In certain cases of application, it may be practical to vary the liquid transport to the process goods, i.e. the substrate. This may be obtained using the fluidic resistance for the treating liquid exiting from the porous roller. Here, the bearing shell may, for example, be provided with a fixed dam or sealable exit openings at both, but at least at one end. In addition, even draining of treating liquid may also be obtained by shaping the edges of the dam and/or the bearing shells.

In embodiments, a variable process flow may be implemented by using different treating liquids in the individual support rollers. When applying different layers, when using multi-component reaction mixtures, when using different concentrations, when specifically stopping a chemical reaction and/or when cleaning or rinsing the substrate, this may, for example, have a considerable positive influence on the quality of the substrate after treating.

Consequently, embodiments are able to provide a method wherein a first treating liquid is delivered via the interior of a first support roller through the porous rigid material to the external surface of the hollow cylinder of the first support roller in order to treat the at least one surface of the substrate by a first treating liquid, and wherein a second treating liquid, which differs from the first treating liquid, is delivered via the interior of a second support roller through the porous rigid material to the external surface of the hollow cylinder of the second support roller in order to treat the at least one surface of the substrate by the second treating liquid. In embodiments, more than two treating liquids may also be used in order to perform more than two different treatments.

In embodiments, an additional medium may be fed onto the surface of the support roller and/or the substrate from outside. For this purpose, nozzles may be provided through which a medium, for example in the form of a liquid or gas, may be applied onto the support roller and/or the substrate in order to support the treatment of the substrate. A corresponding device for feeding a medium may be provided above or below the transport plane of the substrate, as is indicated schematically in FIG. 2 by the reference numeral 47. A highly volatile additive may, for example, be applied directly onto the porous material of the support roller using such a device.

In the embodiments described, the bearing means has the shape of a cylindrical semi-shell. In alternative embodiments, the surface of the bearing means which is opposite to the external surface of the hollow cylinder, which is adapted to the contour of the hollow cylinder, may, in cross section, exhibit the shape of an arc of a circle having a different central angle than 180°, for example a central angle between 135° degrees and 225°. Such a shape allows a stable liquid bearing for the support roller on the one hand and draining of treating liquid via the top edges of the bearing means extending in an axial direction on the other hand. In embodiments, the bearing means may have the shape of a cylindrical shell which surrounds the support roller except for a top region where the substrate rests on during operation.

In the embodiments described, the treating liquid is supplied via an axial end of the respective support roller. In alternative embodiments, the treating liquid may also be supplied via both axial ends, which may support a more homogenous distribution of the treating liquid. In other words, it may be of advantage to feed the distribution system in the form of a filling pipe provided with openings, with liquid from more than one position.

Consequently, embodiments provide devices and methods for wet-chemically treating substrates, wherein the substrates rest on a rotating wetting unit in the form of a roller or cylinder, wherein the liquid delivery to the substrate and substrate wettings take place directly by the rotating wetting unit, wherein the rotating wetting unit may at the same time represent a transport unit. The wetting unit exhibits a stiffness needed for linear and continuous transport of the substrates. In embodiments, the wetting unit may comprise an additional bearing unit (bearing means) and/or and additional leveling means (equalizing means). In embodiments, several roller units in the form of wetting rollers and/or transport rollers, for example at least two roller units, are provided so as to allow a more stable transport of the substrates. In embodiments having several roller units, the rotational direction and the rotational speed between the roller units may vary. In embodiments, the support roller during operation is mechanically fixed and supported in a liquid during rotation. Wetting and transport of the substrate may be independent of the orientation of the substrate. In embodiments, several respective support rollers may be provided of which some serve as a transport unit and some as a wetting unit, wherein transport units and wetting units may comprise identical or different pore sizes. In embodiments, the wetting unit and/or the transport unit have/has a porous stiff cover (hollow cylinder) which is supplied with treating liquid by an internal filling unit, the treating liquid being delivered to the outside of the rollers through the pores of the rollers and typically wetting the substrates homogenously below the transport plane during transport. In addition, an external unit, for example, for spraying the roller, may be provided so as to supply an additional medium.

In embodiments, the treating liquid supplied via each of several rolls may be identical. In embodiments, the treating liquid in different rotating units may vary.

In embodiments, treating is a wet-chemical process. In embodiments, treating takes place below the top side of the substrate. In embodiments, treating is etching, coating, cleaning or rinsing.

In embodiments, the substrates are semiconductor slices and treating includes etching so as to electrically insulate both main surfaces of the semiconductor slices from each other.

In embodiments, treating includes etching using a treating liquid composition which contains alkaline and/or acidic liquids, like NaOH, $Na_2CO_3$, $K_2CO_3$, KOH, HF, HCl, $HNO_3$, $C_2H_4O_2$, and/or $H_2O$, and/or dissolved gases, like $O_3$, for example. In embodiments treating includes coating using a liquid composition containing $H_2O$, metal salts and/or particles. In embodiments treating includes cleaning using a liquid composition containing $H_2O$, tensides, alcohols and/or $O_3$.

In embodiments, the substrate or substrates rest on the support roller(s) only by their weight. Hold-down elements which hold the substrate(s) on the support roller(s) are not required. Embodiments of the device described herein do not comprise hold-down elements and embodiments of the method described here do not use hold-down elements.

Embodiments of the invention offer numerous advantages compared to well-known methods. U.S. Pat. No. 3,616,742 A teaches using a sponge-like roller which is soft and not suitable for heavy substrates. In addition no separate substrates are treated, but a film in one respective device is wetted by only one liquid. The embodiments disclosed here in contrast offer the advantage of flexible treatment, wherein roller A may provide a treatment by a liquid A and roller B a treatment by a liquid A or B in the same device, for example. In addition, several substrates, even different substrate, may be treated in parallel. The treatment in the horizontal plane may be determined decisively by the throughput speed, treating distance and type of treating medium. Direct feeding to the individual roller units allows varying the treating distance, wherein different treating liquids may, for example, be switched between for each roller unit. A roller may, for example, be fed with rinsing water at one time and with an etching liquid at another. Direct feeding allows introducing completely new processes/treating media into an assembly line within the treating distance, without having to amend the apparatus.

In contrast to well-known methods where rollers are immersed into a liquid bath, as are described, for example, in DE 10 2007 063 202 A1 and EP 1 733 418 B1, in the invention described here, no basin for wetting several non-porous rollers is required, thereby improving flexibility and using less treating liquid. In addition, there is a way of continuously feeding fresh liquids. A concentration of reaction products detrimental to the treatment and particles etc., which may arise in well-known methods when treating liquid is not to be circulated can be prevented.

In contrast to the teaching of EP 0 376 207 A2, the procedure described here is not based on forming a meniscus, caused by a dam of a basin where a rotating roller is located. Thus, the method is more robust and more reliable. In contrast to stationary porous applicators, as are known from U.S. Pat. Nos. 5,270,079 A and 4,370,356, support rollers which are supported to be rotatable offer a way of dispensing with additional transport means, wherein a soft treatment is possible since the support roller can move in connection with moving the substrate.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A device for treating substrates by a treating liquid, comprising:
   at least one rotatably supported support roller which a substrate to be treated rests on during operation,
   wherein the support roller comprises a hollow cylinder comprising a porous rigid material which the substrate to be treated rests on during operation,
   wherein the device is configured to deliver, during operation, treating liquid via the interior of the hollow cylinder of the at least one support roller through the porous rigid material to the external surface of the hollow cylinder in order to treat at least one surface of the substrate by the treating liquid,
   wherein the device is configured to treat several substrates in the form of plate-shaped separate wafers arranged one behind the other and/or next to one another in the device by the treating liquid and to transport the substrates in a transport plane during treatment,
   wherein the at least one support roller is supported to be rotatable at lateral portions in an axial direction, wherein the device additionally comprises a bearing comprising a surface which is opposite to a portion of the external surface of the hollow cylinder between the lateral portions, wherein the bearing, when delivering the treating liquid to the external surface of the hollow cylinder, represents a liquid bearing for the support roller,
   wherein the bearing comprises the shape of cylinder shell, wherein axial ends of the cylinder shell are open to allow draining of the treating liquid.

2. The device in accordance with claim 1, wherein the surface of the bearing which is opposite to the external surface of the hollow cylinder, in cross section, comprises the shape of an arc of a circle.

3. The device in accordance with claim 2, wherein a central angle of the arc of the circle is between 135° and 225°, or wherein the arc of the circle surrounds the hollow cylinder except for a top region where the substrate rests on.

4. The device in accordance with claim 1, wherein the bearing extends continuously at least over an axial length of the at least one support roller defining a treating area, or is provided to be segmented over the axial length of the at least one support roller defining the treating area.

5. The device in accordance with claim 1, comprising, for the at least one support roller, a leveling element comprising an edge extending axially along the external surface of the hollow cylinder of the at least one support roller in order to homogenize wetting of the external surface by the treating liquid delivered to the external surface.

6. The device in accordance with claim 1, wherein the porous material is a sintered material.

7. The device in accordance with claim 1, wherein the at least one rotatably supported support roller comprises the hollow cylinder and a filling pipe arranged within the hollow cylinder, wherein the hollow cylinder and the filling pipe are arranged to be concentric to each other with a gap therebetween, wherein the gap is fluidically coupled to the interior of the filling pipe by openings in the filling pipe.

8. The device in accordance with claim 1, wherein the at least one rotatably supported support roller is a driven support roller configured to transport the substrate during the treatment.

9. The device in accordance with claim 1, comprising, in addition to the at least one support roller, transport rollers configured to transport the substrate during the treatment.

10. The device in accordance with claim 1, wherein the at least one support roller is one among several respective support rollers arranged along a transport path along which the substrate is transported during the treatment.

11. The device in accordance with claim 10, configured to deliver a first treating liquid to the external surface of a first one of the several respective transport rollers and to deliver a second treating liquid, which differs from the first treating liquid, to the external surface of a second one of the several support rollers.

12. The device in accordance with claim 1, further comprising nozzles for feeding a medium from outside to the surface of the support roller or to the substrate.

13. The device in accordance with claim 1, wherein the external surface of the hollow cylinder which the substrate rests on during operation, in addition to the pores of the porous material, comprises recesses and/or protrusions in the form of longitudinal grooves and/or pockets.

14. A method for treating substrates by a treating liquid using a device in accordance with claim 1, comprising:
   delivering treating liquid via the interior of the hollow cylinder of the at least one support roller through the porous rigid material to the external surface of the hollow cylinder in order to treat the at least one surface of the substrate by the treating liquid.

15. The method in accordance with claim 14, wherein treating is etching, coating, cleaning or rinsing.

16. The method in accordance with claim 14, wherein the substrates are semiconductor slices.

17. The method in accordance with claim 16, wherein treating comprises etching in order to electrically insulate both main surfaces of the semiconductor slices from each other.

18. The method in accordance with claim 14, comprising:
   delivering a first treating liquid via the interior of the hollow cylinder of a first support roller through the porous rigid material to the external surface of the hollow cylinder of the first support roller in order to treat the at least one surface of the substrate by a first treating liquid, and
   delivering a second treating liquid, which differs from the first treating liquid, via the interior of the hollow cylinder of a second support roller through the porous rigid material to the external surface of the hollow cylinder of the second support roller in order to treat the at least one surface of the substrate by the second treating liquid, wherein the first and second support rollers are arranged along a transport path along which the substrate is transported during the treatment.

19. The method in accordance with claim 14, further comprising feeding a medium from outside to the surface of the substrate roller or to the substrate.

\* \* \* \* \*